(12) United States Patent
Otto et al.

(10) Patent No.: US 9,825,208 B2
(45) Date of Patent: Nov. 21, 2017

(54) METHOD OF PRODUCING AN OPTOELECTRONIC SEMICONDUCTOR COMPONENT

(71) Applicant: OSRAM Opto Semiconductors GmbH, Regensburg (DE)

(72) Inventors: Isabel Otto, Regensburg (DE); Ion Stoll, Tegernheim (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/506,059

(22) PCT Filed: Aug. 27, 2015

(86) PCT No.: PCT/EP2015/069645
§ 371 (c)(1),
(2) Date: Feb. 23, 2017

(87) PCT Pub. No.: WO2016/034489
PCT Pub. Date: Mar. 10, 2016

(65) Prior Publication Data
US 2017/0250323 A1    Aug. 31, 2017

(30) Foreign Application Priority Data

Sep. 4, 2014 (DE) .................. 10 2014 112 769

(51) Int. Cl.
*H01L 33/50* (2010.01)
*H01L 25/075* (2006.01)
(Continued)

(52) U.S. Cl.
CPC ............ *H01L 33/504* (2013.01); *C25D 13/02* (2013.01); *C25D 13/12* (2013.01);
(Continued)

(58) Field of Classification Search
CPC ................. H01L 33/504; H01L 33/005; H01L 2933/0041; C25D 13/12; C25D 13/02
See application file for complete search history.

(56) References Cited

U.S. PATENT DOCUMENTS

| 5,608,568 | A   | * | 3/1997 | Blodgett | ............... | G02F 1/0147 359/245 |
| 2006/0152960 | A1 | * | 7/2006 | Sheats | ................. | H01L 51/0034 365/112 |
| 2015/0207043 | A1 | * | 7/2015 | Pfeuffer | ................ | H01L 27/156 438/29 |

FOREIGN PATENT DOCUMENTS

| DE | 10 2011 111 980 A1 | 2/2013 |
| DE | 10 2012 106 859 A1 | 1/2014 |

(Continued)

OTHER PUBLICATIONS

Andrew J. Pascall et al., "Light-Directed Electrophoretic Deposition: A New Additive Manufacturing Technique for Arbitrarily Patterned 3D Composites," Advanced Materials, 2014.

*Primary Examiner* — Caridad Everhart
(74) *Attorney, Agent, or Firm* — DLA Piper LLP (US)

(57) ABSTRACT

A method of producing an optoelectronic semiconductor component includes providing a semiconductor body; applying a photoconductive layer on a radiation exit surface of the semiconductor body, wherein the semiconductor body emits electromagnetic radiation during operation; exposing at least one sub-region of the photoconductive layer with electromagnetic radiation generated by the semiconductor body; and depositing a conversion layer on the sub-region of the photoconductive layer by an electrophoresis process.

13 Claims, 5 Drawing Sheets

(51) Int. Cl.
*H01L 33/00* (2010.01)
*C25D 13/02* (2006.01)
*C25D 13/12* (2006.01)

(52) U.S. Cl.
CPC ........ *H01L 25/0753* (2013.01); *H01L 33/005* (2013.01); *H01L 2933/0041* (2013.01)

(56) References Cited

FOREIGN PATENT DOCUMENTS

| | | |
|---|---|---|
| DE | 10 2012 108 704 A1 | 3/2014 |
| DE | 10 2012 108 996 A1 | 4/2014 |
| WO | 2015/024801 A1 | 2/2015 |

* cited by examiner

METHOD OF PRODUCING AN OPTOELECTRONIC SEMICONDUCTOR COMPONENT

TECHNICAL FIELD

This disclosure relates to a method of producing an optoelectronic semiconductor component.

BACKGROUND

There is a need for a method that allows applying a conversion layer to relatively small regions of an optoelectronic semiconductor component. In particular, there is a need for a method that allows applying conversion layers to relatively small sub-pixel regions to generate various colors.

SUMMARY

We provide a method of producing an optoelectronic semiconductor component including providing a semiconductor body; applying a photoconductive layer on a radiation exit surface of the semiconductor body, wherein the semiconductor body emits electromagnetic radiation during operation; exposing at least one sub-region of the photoconductive layer with electromagnetic radiation generated by the semiconductor body; and depositing a conversion layer on the sub-region of the photoconductive layer by an electrophoresis process.

DETAILED DESCRIPTION

Figure 1:
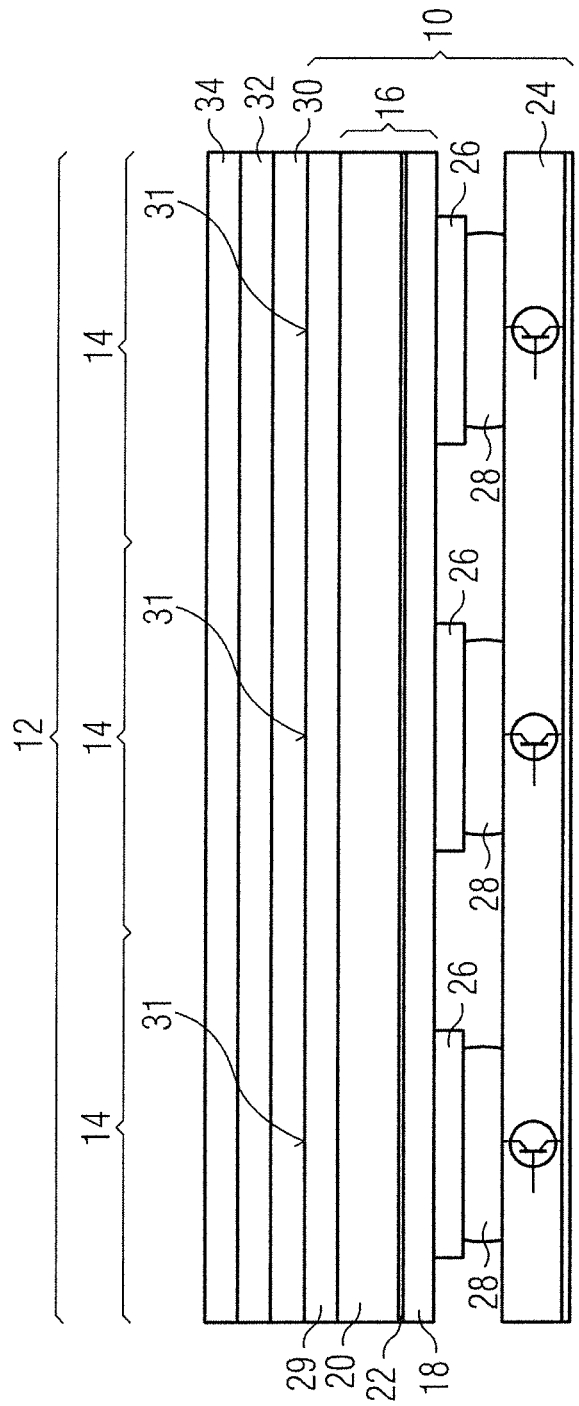
FIGS. 1 to 5 are schematic sectional views of our method according to a first example.

Our method of producing a semiconductor component provides a semiconductor body. A photoconductive layer is applied to a radiation exit surface of the semiconductor body. The semiconductor body is designed to emit electromagnetic radiation during operation.

If a layer or a component is referred to as being arranged or applied "on" or "over" another layer or another component or also "between" two other layers or components, this may herein and in the following mean that the one layer or the one component is arranged in direct mechanical and/or electrical contact on the other layer or the other component. It may further mean that the one layer or the one component is arranged directly on or above the other layer or the other component. In this case, further layers and/or components may be arranged between the one and the other layer or the one and the other component.

Exposure of at least one sub-region of the photoconductive layer may be effected by electromagnetic radiation generated by the semiconductor body.

The photoconductive layer contains a photoconductive material. Here and in the following, a photoconductive material refers to a material that experiences an increase in its electrical conductivity upon impact of electromagnetic radiation, in particular of radiation in a visible wavelength range, for example, under impact of the internal photoelectric effect. In particular, regions of the photoconductive layer exposed to electromagnetic radiation may locally comprise a higher electrical conductivity than other regions on which no electromagnetic radiation impinges.

The bandgap of the photoconductive layer is preferably 0.8-3.6 eV, particularly preferably 1-3 eV. The dark resistance of the photoconductive layer is preferably at least 0.1 M$\Omega$, particularly preferably at least 1 M$\Omega$, for example, at least 10 M$\Omega$. Furthermore, it is less than 100 M$\Omega$, for example. With an exposure intensity of, for example, 0.1 W/mm2, the conductivity increases preferably by an order of 0.001-14, particularly preferably by an order of 0.01-5, for example, by an order of 0.1-1. The charge carrier diffusion (particularly in a lateral direction) in the photoconductive layer should be small so that due to diffusion, no or only a few charge carriers are provided in neighboring pixels or sub-pixels.

Deposition of a conversion layer on the (exposed or at least temporarily exposed) sub-region of the photoconductive layer may be effected by an electrophoretic process. The conversion layer is suitable to convert electromagnetic radiation of a first wavelength range into radiation of a second wavelength range. In other words, the conversion layer is designed to be wavelength-converting.

The term "wavelength-converting" means in particular that radiated electromagnetic radiation of a certain wavelength range is converted into electromagnetic radiation of another, preferably longer-wave wavelength range. In general, a wavelength-converting element absorbs electromagnetic radiation of an irradiated wavelength range, converts it into electromagnetic radiation of a different wavelength range via electronic processes on an atomic and/or molecular level, and re-emits the converted electromagnetic radiation. In the electrophoretic process, the phosphor particles to be applied, for example, of the phosphor, are accelerated by an electrical field such that a layer of the phosphor particles is deposited on a provided surface. Generally, the surface to be coated is provided in an electrophoretic bath containing the phosphor particles which are to form the conversion layer, in a suspension. In the electrophoretic process, the phosphor particles are only deposited on those parts of the surface designed to be electrically conductive. Depending on the electrical conductivity of these regions, deposition of the phosphor generally ensues in a different manner.

Due to the fact that an electrophoretic deposition is essentially only effected in the exposed or at least temporarily exposed sub-region of the photoconductive layer, a particularly good determination of the lateral position of the conversion layer is possible. It can be applied with a particularly high, preferably pixel-fine resolution in particular. Furthermore, it is not necessary to determine the position of the conversion layer by lithographic processes (for example, by an n-side photo technique) having a resolution that is in many cases worse than the desired pixel size. As a result, the number of lithographic steps during the manufacturing process of the optoelectronic components is reduced, thereby omitting that masks have to be provided.

In addition, it is possible to apply multiple different conversion layers having different conversion materials next to each other on very small areas. There are different options to define neighboring pixels of different or identical color.

As explained above, in the method, a conversion layer is electrophoretically deposited on a photoconductive layer. A method of applying a conversion layer to a photoconductive layer is described in A. J. Pascall et al., Adv. Mater. Volume 26, Issue 14, pages 2252-2256, for example, the subject matter of which is incorporated herein by reference.

The photoconductive layer may contain $TiO_2$ (for example, n-doped $TiO_2$, for example, Nb-doped), ZnO (for example, n-doped ZnO, for example, In-doped), ZnS, ZnSe, CdS, $SrTiO_3$, AgI, GaN, $In_xGa_{1-x}N$, $FeTiO_3$, or consists of one of these materials. It is also possible to use organic semiconductor materials and photo semiconductors in the photoconductive layer. Organic semiconductors are molecules, oligomers and polymers based on organic molecules (also organic metal complexes, for example).

The photoconductive layer can be produced by an application method such as a vapor coating or deposition method, for example. Such an application method may be a method for chemical vapor deposition, CVD, or a method for physical vapor deposition, PVD, or a combination of such methods. Examples of such application methods are atomic layer deposition (ALD), thermal evaporation, electron beam evaporation, laser beam evaporation (PLD), electric arc evaporation, molecular beam epitaxy, sputtering, magnetron sputtering, laser ablation and plasma enhanced chemical vapor deposition. Alternatively, the photoconductive layer may be applied by an electrophoretic process or wet chemically to the radiation exit surface of the semiconductor body.

The thickness of the photoconductive layer may be 10 nm to 5 μm, in particular 100 nm to 500 nm.

The conversion layer typically comprises phosphor particles of a phosphor that provides the conversion layer with the wavelength-converting properties.

For the phosphor particles, one of the following materials is suitable, for example: garnets doped with rare earths, alkaline earth sulphides doped with rare earths, thiogallates doped with rare earths, aluminates doped with rare earths, silicates doped with rare earths, orthosilicates doped with rare earths, chlorosilicates doped with rare earths, alkaline earth silicon nitrides doped with rare earths, oxynitrides doped with rare earths, aluminum oxynitrides doped with rare earths, silicon nitrides doped with rare earths, SiAlONe doped with rare earths. In particular, phosphors may be used as described by general formulas: $(Y, Lu, Gd, Tb)_3 (Al_{1-x}, Ga_x)_5O_{12}:Ce^{3+}$; $(Ca, Sr) AlSiN_3:Eu^{2+}$, $Sr (Ca, Sr) Si_2Al_2N_6$: $Eu^{2+}$, $(Sr, Ca) AlSiN_3*Si_2N_2O:Eu^{2+}$, $(Ca, Ba, Sr)_2Si_5N_8$: $Eu^{2+}$; $(Ca, Sr) Al_{(1-4x/3)}Si_{(1+x)}N_3:Ce$; (x=0.2-0.5); $(Ba, Sr, Ca) Si_2O_2N_2: Eu^{2+}$, $AE_{2-x-a}RE_xEu_aSi_{1-y}O_{4-x-2y}N_x)$, $(Ba, Sr, Ca)_2SiO_4:Eu^{2+}$; $Ca_8Mg (SiO_4)_4Cl_2:Eu^{2+}$ (AE=alkaline earth metals, RE=rare earth metals).

Particularly preferably relatively small phosphors are used in the method to coat relatively small sub-pixel regions, for example. Particularly preferably, the diameter of the phosphor particles does not exceed a value of 5 micrometers. The average phosphor particle size may be 20 nanometers to 30 micrometers, particularly preferably 500 nanometers to 5 micrometers, for example, not more than 1 micrometer.

It is also possible, however, to use nanoparticles, for example, made of CdS, CdSe, ZnS, InP or so-called "core-shell" nanoparticles as phosphor particles. Preferably, the full width at half-maximum of the emission of the nanoparticles does not exceed a value of 50 nm. The nanoparticles preferably have a size of 2 nm to 100 nm.

The photoconductive layer may be directly applied to a semiconductor layer of the semiconductor body or to an electrode surface electrically-conductively connected to the semiconductor layer. In this arrangement, the photoconductive layer is set to the potential of the semiconductor layer.

Thus, it is not necessary to provide a current supply of the photoconductive layer independent of the current supply of the semiconductor body. The voltage applied to the semiconductor body to generate electromagnetic radiation is simultaneously used to allow for the electrophoretic deposition of the conversion layer.

The photoconductive layer may be applied to an insulation layer that covers a semiconductor layer of the semiconductor body at least partially.

The photoconductive layer may be applied to an electrically-conductive layer electrically insulated from the semiconductor body by an insulation layer. In this arrangement, the photoconductive layer may be set to a desired potential independent of the semiconductor body that allows for the electrophoretic deposition of the conversion layer. The electrical layer may be contacted from the side of the semiconductor body, for example.

The photoconductive layer may be applied to a carrier provided on a radiation exit surface of the semiconductor body, but is not mechanically connected to the semiconductor body and may also be spaced apart from the semiconductor body. The carrier may be made of glass, transparent ceramics, sapphire or plastic, for example. After depositing the conversion layer(s), the carrier is introduced into the light path of the semiconductor body.

The semiconductor body may comprise at least one pixel region. The pixel region comprises at least two different sub-pixel regions. Preferably, the sub-pixel regions are designed to be electrically insulated from each other. Each sub-pixel area preferably comprises an active layer which is suitable to allow, during operation of the semiconductor body, emission of electro-magnetic radiation of a first wavelength range. Particularly preferably, the first wavelength range comprises blue light (with a peak wavelength of 370 to 500 nm) or is formed of blue light.

The sub-pixel regions comprise a side length of at most 150 micrometers, for example. The sub-pixel regions may be separated from each other by trenches, for example. The sub-pixel regions are arranged at a distance from each other, for example. The distance between two directly neighboring sub-pixel regions has a value of not more than 10 micrometers, for example. Particularly preferably, an edge length of a sub-pixel region is smaller or equal to 5 micrometers and an expansion of the trench is smaller or equal to 2 micrometers.

Furthermore, the photoconductive layer is applied to the radiation exit surface of at least one of the sub-pixel regions, in particular by applying current only to the one sub-pixel region and thus only exposing the radiation exit surface of the sub-pixel region, whereby the electrical conductivity of the photoconductive layer in the sub-pixel region is increased.

When electrophoretically depositing the conversion layer, the sub-pixel region onto which the conversion layer is applied may be supplied with current independently of the other sub-pixel regions. In this manner, the conversion layer may be applied locally only to the sub-pixel region currently supplied with current, while the remaining sub-pixel regions having no current supplied thereto remain free from the conversion layer.

If the sub-pixel regions can be individually supplied with current when depositing the conversion layer, it is particularly easy to provide the semiconductor body with a conversion layer and, in particular, to provide different sub-pixel regions particularly easy with different conversion layers. To that end, the semiconductor body is subsequently brought into different suspensions having different phosphor particles. This allows providing sub-pixel regions having different colors or color locations.

Preferably, each pixel region comprises exactly three sub-pixel regions. For example, one of the three sub-pixel regions is provided to emit green light, while another sub-pixel region is provided to generate red light and the third sub-pixel region radiates blue light. If, for example, the first wavelength range comprises blue light, a sub-pixel region is particularly preferably free from a conversion layer here. Another sub-pixel region preferably comprises a conversion layer suitable to convert electromagnetic radiation of the first blue wavelength range partially or to an extent of more than 95% of its intensity into electromagnetic radiation of a second wavelength range, wherein the second wavelength range preferably comprises consists of green light. The third sub-pixel region preferably comprises another conversion layer suitable to convert blue radiation of the first wavelength range partially or to an extent of more than 95% of its intensity into radiation of a third wavelength range, which preferably comprises or consists of red light. The conversion layers are particularly preferably designed to convert radiation of the first wavelength range as completely as possible into radiation of the second or third wavelength range.

The electrophoretic process may take place by applying a voltage between the photoconductive layer and a counter electrode. The counter electrode is preferably provided on the side of the photoconductive layer facing away from the semiconductor body.

The process of exposing the sub-region of the photoconductive layer and the electrophoretic process may be performed in an alternating manner. By exposing the photoconductive layer, charge carriers therein, which subsequently support the electrophoretic deposition of the illumination particles, are separated. For example, the process of exposing the sub-region of the photoconductive layer and the electrophoretic process may be effected in a fast time sequence, for example, with a frequency of 1 MHz to 1 Hz.

The photoconductive layer may be removed after electrophoretic deposition of the conversion layer, for example, by a wet chemical method.

Further advantages and developments of our methods result from the examples described hereinafter in conjunction with the figures.

Like, similar or identical elements are provided with the same reference numerals throughout the figures. The figures and the size ratios of the components shown in the figures with respect to each other are not to be considered as true to scale. Individual elements, in particular layer thicknesses, may be shown in an exaggerated size for the purpose of better illustration and/or better understanding.

In the method step shown in FIG. 1, a semiconductor body 10 is provided having a photoconductive layer 34 applied to its radiation exit surface.

The semiconductor body 10 according to the example in FIG. 1 comprises a pixel region 12 having three sub-pixel regions 14. Each sub-pixel region 14 comprises a semiconductor layer sequence 16 having a first semiconductor layer 18 of a first conductivity type (presently a layer made of p-GaN), a second semiconductor layer 20 of a second conductivity type (presently a layer made of n-GaN) and an active layer 22 formed therebetween, which is suitable to generate electromagnetic radiation of a first wavelength range. In this example, the active layer 22 is suitable to generate visible blue light.

In this example, the sub-pixel regions 14 merge into each other, i.e., the semiconductor layer sequences 16 of neighboring sub-pixel regions are not isolated from each other. In contrast, in a not illustrated example, two directly neighboring sub-pixel regions are each separated from one other by one trench. The trench completely separates the active layer. Furthermore, the trench also at least partially separates the semiconductor layer sequence.

The semiconductor body 10 shown in FIG. 1 further comprises a carrier element 24 having the pixel region 12 arranged thereon. Between the carrier element 24 and the semiconductor layer sequence 16, a plurality of contacts 26 is arranged that are electrically conductively connected to the first semiconductor layer 18 and fastened to the carrier element 24 by solder layers 28. The carrier element 24 may, for example, be an active matrix element of a display.

The semiconductor layer sequence 16 has a transparent electrode 29 arranged thereon, via which the front sides of the sub-pixel regions 14 are electrically contacted. The transparent electrode 29 is applied to the entire surface of a front side of the pixel region 12 and forms radiation exit surfaces 31 of the sub-pixel regions 14.

The transparent electrode 29 is particularly preferably made of a TCO material ("TCO" for transparent conductive oxide) or comprises a TCO material. Transparent conductive oxides are generally metal oxides such as, for example, zinc oxide, tin oxide, cadmium oxide, titanium oxide, indium oxide or indium tin oxide (ITO).

It is to be noted that the figures show, by way of example, only one pixel region 12 having three sub-pixel regions 14, but the semiconductor body 1 typically comprises a plurality of such pixel regions 12. The pixel regions 12 are particularly preferably all have the same design.

In the example shown in FIG. 1, a photoconductive layer 34 is applied to an electrically conductive layer 32, which is electrically insulated from the transparent electrode 29 by an insulation layer 30. The electrically conductive layer 32, similar to the electrode 29, has a transparent design and preferably comprises a TCO material. Both the electrode 29 and the electrically conductive layer 32 can be contacted from one side of the semiconductor body (not shown). In the arrangement shown in FIG. 1, the electrically conductive layer 32 and therefore also the photoconductive layer 34 electrically connected thereto can be set independently of the semiconductor body (especially independently of the potential of the transparent electrode 29) to a desired potential, which allows the electrophoretic deposition of the conversion layer.

Figure 2:
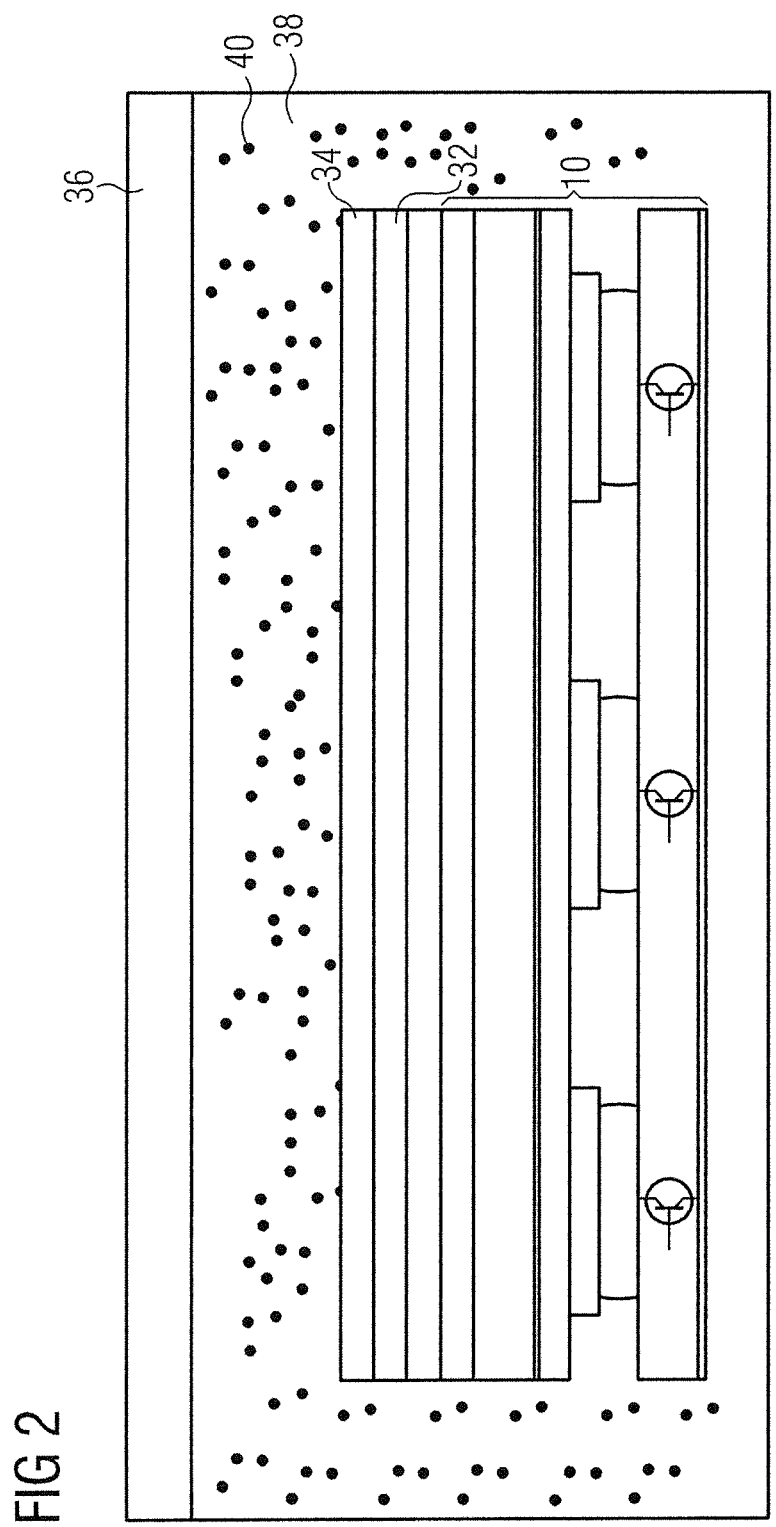

In the method step shown in FIG. 2, the arrangement with the semiconductor body 10 and the photoconductive layer 34 applied thereto shown in FIG. 1 is provided in an electrophoretic bath 38 containing the phosphor particles 40 to form the conversion layer in a suspension. The electrophoretic process performed later results from applying a voltage between the electrically conductive layer 32 and the photoconductive layer 34 on the one hand and a counter-electrode 36 on the other hand. The counter-electrode 36 is arranged on the side of the photoconductive layer 29 facing away from the semiconductor body 10 and spaced apart therefrom so that the space between the counter-electrode 36 and the photoconductive layer 34 is filled with the suspension and the phosphor particles 40 contained therein.

Figure 3:
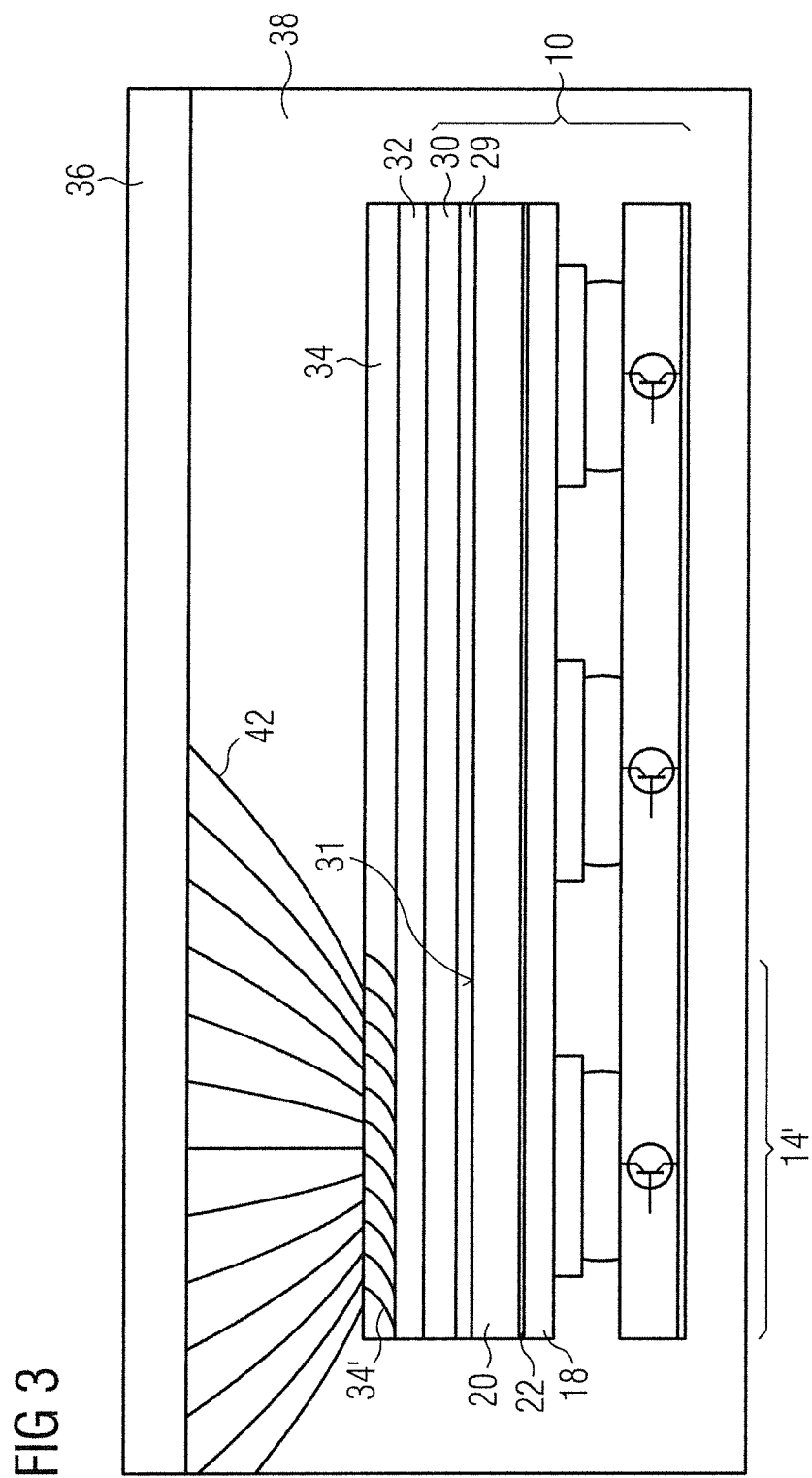

In the method step shown in FIG. 3, a sub-region 34' of the photoconductive layer, shown in FIG. 3 in a hatched manner, is exposed to electromagnetic radiation generated by the semiconductor body 10. A sub-pixel region 14' on which the conversion layer is to be applied, is supplied with current independently of the other sub-pixel regions, that means electromagnetic radiation is generated only in the sub-pixel region 14'. The photoconductive layer 34 consequently locally comprises a higher conductivity in the exposed sub-region 34' than the remaining regions onto which no electromagnetic radiation impinges.

Figure 4:
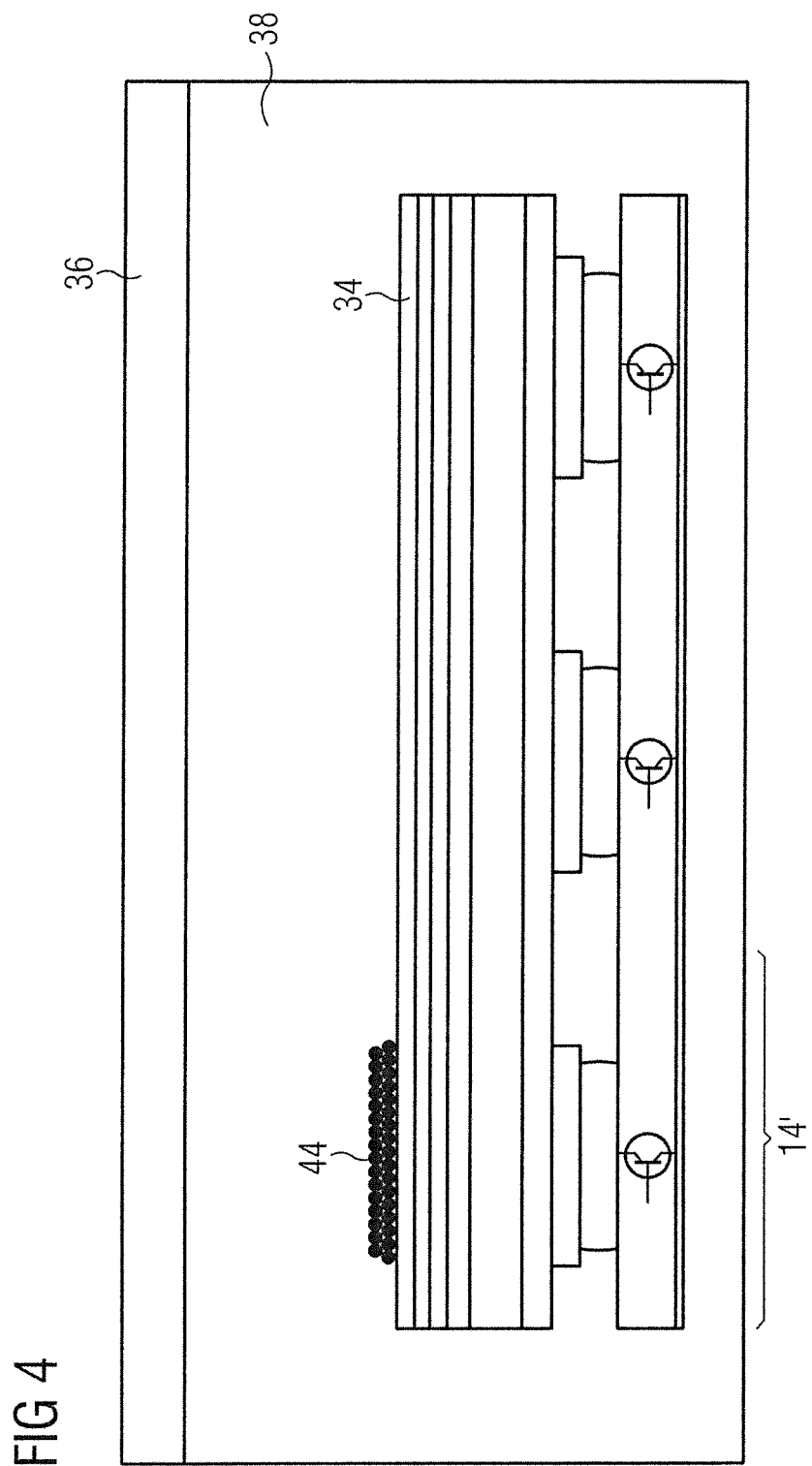

If a suitable voltage is now applied between the counter-electrode 36 and the electrically conductive layer 32, an electrical field 42 is generated having its field line density within the space between the counter electrode 36 and the sub-region 34 increased due to this increased electrical conductivity. As a consequence, current flows along the field lines 42 and an electrophoretic deposition of phosphor particles takes place. As shown in FIG. 4, a conversion layer 44 is locally only or at least predominantly applied to the sub-pixel region 14 that has just been supplied with current, while the remaining sub-pixel regions having no currents supplied thereto remain free of the conversion layer or are only slightly covered by the conversion layer.

The conversion layer 44 is suitable to convert electromagnetic radiation of the first (blue) wavelength range into electromagnetic radiation of a second wavelength range. The second wavelength range is formed of green light.

Figure 5:
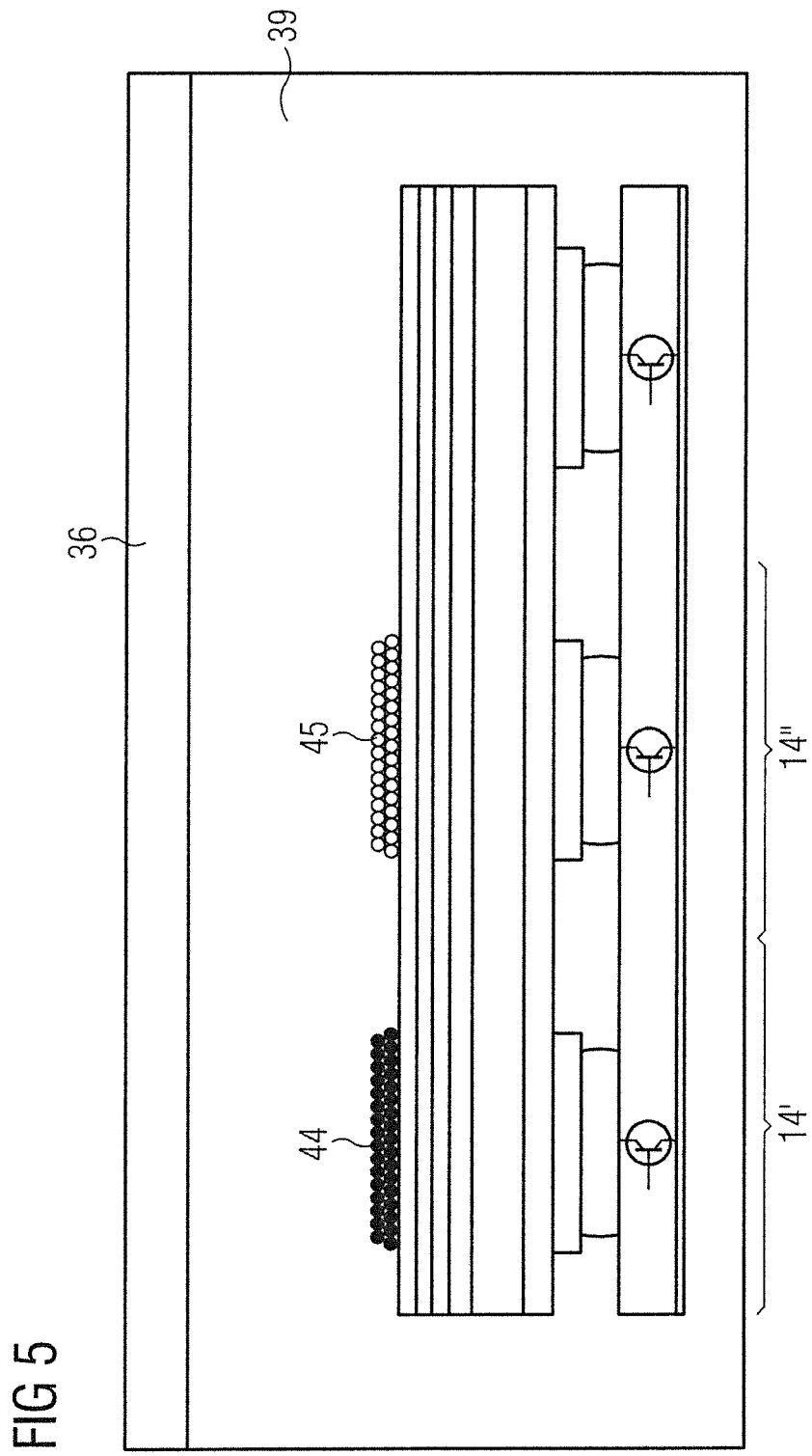

In a subsequent method step indicated in FIG. 5, the process shown in FIGS. 1 to 4 is repeated in an electrophoretic bath 39 containing phosphor particles, which are to form the second conversion layer 45, in a suspension. During the electrophoretic deposition of the second conversion layer 45, only the sub-pixel region 14" to which the conversion layer 45 is to be supplied, is supplied with current. Therefore, phosphor particles attach to this sub-pixel region 14" in the electrophoretic process.

The second conversion layer 45 is suitable to convert electromagnetic radiation of the first wavelength range into electromagnetic radiation of a third wavelength range different from the first and the second wavelength range. Particularly preferably, the second conversion layer 45 is suitable to convert blue light generated in the active layer as completely as possible into red light.

The method described herein is not limited by the description of the examples. Rather, this disclosure comprises each new feature as well as any combination of features, in particular including any combination of features in the appended claims, even though the respective feature or combination is not explicitly specified in the claims or examples.

This application claims priority of DE 10 2014 112 769.2, the subject matter of which is incorporated herein by reference.

The invention claimed is:

1. A method of producing an optoelectronic semiconductor component comprising:
    providing a semiconductor body;
    applying a photoconductive layer on a radiation exit surface of the semiconductor body, wherein the semiconductor body emits electromagnetic radiation during operation;
    exposing at least one sub-region of the photoconductive layer with electromagnetic radiation generated by the semiconductor body; and
    depositing a conversion layer on the sub-region of the photoconductive layer by an electrophoresis process.

2. The method according to claim 1, wherein the photoconductive layer is applied to the radiation exit surface of the semiconductor body by CVD, ALD, PLD, PVD, an electrophoresis process or wet-chemically.

3. The method according to claim 1, wherein the photoconductive layer is directly applied to a semiconductor layer of the semiconductor body.

4. The method according to claim 1, wherein the photoconductive layer is applied to an insulation layer that at least partially covers a semiconductor layer of the semiconductor body.

5. The method according to claim 1, wherein the photoconductive layer is applied to an electrically conductive layer that is electrically insulated from the semiconductor body by an insulation layer.

6. The method according to claim 1, wherein the sub-pixel region to which the conversion layer is applied is supplied with current in the electrophoretic process independently of the other sub-pixel region.

7. The method according to claim 1, wherein the first wavelength range comprises blue light, the second wavelength range comprises green light and the third wavelength range comprises red light.

8. The method according to claim 1, wherein the photoconductive layer contains or consists of $TiO_2$, ZnO, ZnS, ZnSe, CdS, $SrTiO_3$, ZnO, AgI, GaN, $In_xGa_{1-x}N$, $FeTiO_3$.

9. The method according to claim 8, wherein a thickness of the photoconductive layer is 10 nm to 5 μm.

10. The method according to claim 1, wherein the semiconductor body comprises at least one pixel region comprising at least two different sub-pixel regions, wherein each sub-pixel region comprises an active layer suitable to emit electromagnetic radiation of a first wavelength range, and in which the photoconductive layer is applied to the radiation exit surface of at least one sub-pixel region.

11. The method according to claim 10, wherein
    a first sub-pixel region is provided with a first conversion layer suitable to convert radiation of the first wavelength range into radiation of the second wavelength range; and
    a second sub-pixel region is provided with a further conversion layer suitable to convert radiation of the first wavelength range into radiation of a third wavelength range different from the first and the second wavelength range.

12. The method according to claim 1, wherein a voltage is applied between the photoconductive layer and a counter-electrode arranged on the side of the photoconductive layer facing away from the semiconductor body.

13. The method according to claim 12, wherein exposure of the sub-region of the photoconductive layer and the electrophoretic process are performed in an alternating manner.

* * * * *